United States Patent
Sugiyama et al.

(10) Patent No.: US 8,373,437 B2
(45) Date of Patent: Feb. 12, 2013

(54) LOOK-UP TABLE CIRCUITS AND FIELD PROGRAMMABLE GATE ARRAY

(75) Inventors: Hideyuki Sugiyama, Kawasaki (JP);
Tetsufumi Tanamoto, Kawasaki (JP);
Takao Marukame, Tokyo (JP); Mizue Ishikawa, Yokohama (JP); Tomoaki Inokuchi, Yokohama (JP); Yoshiaki Saito, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/238,020

(22) Filed: Sep. 21, 2011

(65) Prior Publication Data

US 2012/0074984 A1    Mar. 29, 2012

(30) Foreign Application Priority Data

Sep. 28, 2010    (JP) .................................. 2010-217799

(51) Int. Cl.
*G06F 7/38* (2006.01)
*H03K 19/173* (2006.01)
(52) U.S. Cl. ................................ 326/37; 326/38; 326/39
(58) Field of Classification Search .............. 326/37–41, 326/47, 113
See application file for complete search history.

(56) References Cited

U.S. PATENT DOCUMENTS

| | | | | |
|---|---|---|---|---|
| 7,321,237 B2 * | 1/2008 | McCollum et al. | ............. | 326/37 |
| 7,796,423 B2 | 9/2010 | Sugiyama et al. | | |
| 2008/0205119 A1 * | 8/2008 | Nagai et al. | ................... | 365/148 |

FOREIGN PATENT DOCUMENTS

| | | |
|---|---|---|
| JP | 9-204773 | 8/1997 |
| JP | 4435236 B2 | 3/2010 |

OTHER PUBLICATIONS

Japanese Office Action mailed Sep. 25, 2012 in Japanese Patent Application No. 2010-217799 filed Sep. 28, 2010 (with English translation).

* cited by examiner

*Primary Examiner* — Anh Tran
(74) *Attorney, Agent, or Firm* — Oblon, Spivak, McClelland, Maier & Neustadt, L.L.P.

(57) ABSTRACT

A look-up table circuit according to an embodiment includes: a variable resistance circuit including variable resistance devices and selecting a variable resistance device from the variable resistance devices based on an input signal; a reference circuit having a resistance value between the largest resistance value and the smallest resistance value of the variable resistance circuit; a first n-channel MOSFET including a source connected to a terminal of the variable resistance circuit and a gate connected to a drain; a second n-channel MOSFET including a source connected to a terminal of the reference circuit and a gate connected to the gate of the first n-channel MOSFET; a first current supply circuit to supply a current to the variable resistance circuit; a second current supply circuit to supply a current to the reference circuit; and a comparator comparing voltages at a first input terminal and a second input terminal.

16 Claims, 14 Drawing Sheets

LOOK-UP TABLE CIRCUITS AND FIELD PROGRAMMABLE GATE ARRAY

CROSS-REFERENCE TO RELATED APPLICATION

This application is based upon and claims the benefit of priority from prior Japanese Patent Application No. 2010-217799 filed on Sep. 28, 2010 in Japan, the entire contents of which are incorporated herein by reference.

FIELD

Embodiments described herein relate generally to look-up table circuits and a field programmable gate array.

BACKGROUND

As the miniaturization technique has advanced in recent years, circuits have become more complicated, and the costs related to the development of semiconductor chips have become higher.

In a reconfigurable logic circuit, circuit logics can be changed after manufacture of the hardware; accordingly, by reconfiguring logic circuits, defects can be corrected and functions can be added.

As reconfigurable logic circuits based on today's semiconductor techniques, there are integrated circuits called field programmable gate arrays (FPGAs). An FPGA stores information in internal SRAMs (Static Random Access Memories), and according to the contents stored in the memories, the FPGA can control the logics and connections in the reconfigurable logic circuit. Since logics can be changed through software, circuit corrections can be made after manufacture of the hardware. Such FPGAs are rapidly spreading as the means to produce ever more complicated integrated circuits in a short time and at low costs.

The logic section of each FPGA is formed by circuits called look-up table circuits. A look-up table circuit stores logics in a memory, and according to the contents stored in the memory, the look-up table circuit performs outputting. A logic circuit including such look-up table circuits is a reconfigurable logic circuit that can support any logics, however, since it includes a large number of devices, it is difficult to achieve high integration.

Where look-up table circuits are manufactured by a semiconductor CMOS technique, SRAMs are used as the memories to store information. Therefore, the number of devices becomes large. Since a multiplexer used in each look-up table circuit also requires a large number of devices, the circuit size of each look-up table circuit becomes very large.

If look-up table circuits with small circuit areas are used, a highly-integrated FPGA can be realized. As the look-up table circuits with small circuit areas, look-up table circuits using spin MOSFETs have been suggested. With the use of look-up table circuits using spin MOSFETs, a highly-integrated FPGA can be realized. A spin MOSFET has a structure that combines a ferromagnetic material and a semiconductor, and accordingly, a memory function and a logic function can be embodied by one device. That is why the spin MOSFETs have attracted attention in recent years.

A look-up table circuit using spin MOSFETs reads the resistance values of the spin MOSFETs, and determines an output in accordance with the resistance values. To read a resistance value, the look-up table circuit reads the voltage applied to the spin MOSFET, compares the voltage with the resistance value of a reference resistance, and determines the magnitude of the resistance value. The look-up table circuit uses a comparator as the circuit to determine the magnitude of the resistance value; however, since the operation speed of a comparator is low, the circuit has a problem in that its operation speed is also low accordingly. The operation time of a look-up table circuit can be regarded as the period of time elapsing from a change in input to a change in output. If the operating time of each look-up table circuit is long, the operation time of the entire FPGA is long; therefore, there is a demand for high-speed look-up table circuits. Particularly, in a case where multi-input signals for image processing or the like are dealt with, high-speed operations of the logic unit including look-up table circuits greatly contributes to an increase in processing speed.

DETAILED DESCRIPTION

A look-up table circuit according to an embodiment includes: a variable resistance circuit comprising a plurality of variable resistance devices and selecting a variable resistance device from the plurality of variable resistance devices based on an input signal, a first terminal of the variable resistance circuit being connected to a ground voltage; a reference circuit having a resistance value between the largest resistance value and the smallest resistance value of the variable resistance circuit, a first terminal of the reference circuit being connected to the ground voltage; a first n-channel MOSFET comprising a source connected to a second terminal of the variable resistance circuit, and comprising a gate and a drain connected each other; a second n-channel MOSFET comprising a source connected to a second terminal of the reference circuit and comprising a gate connected to the gate of the first n-channel MOSFET; a first current supply circuit to supply a current to the variable resistance circuit through the drain of the first n-channel MOSFET; a second current supply circuit to supply a current to the reference circuit through a drain of the second n-channel MOSFET; and a comparator to compare voltages at a first input terminal and a second input terminal, the first input terminal connected to the drain of the first n-channel MOSFET and the second input terminal connected to the drain of the second n-channel MOSFET.

The following is a detailed description of embodiments, with reference to the accompanying drawings. It should be noted that the drawings are schematic, and the sizes of respective components, the magnitudes of respective voltages and the lengths of respective times, the size ratios between parts, the ratios between the voltages, the time intervals are different from those of actual circuits. Also, the same part may have different sizes or different proportions among the drawings.

As for the voltage of each signal, a high voltage is referred to as the H level, and a low voltage is referred to as the L level. The H level represents voltages that are higher than half a power supply voltage Vdd, and the L level represents voltages that are lower than half the power supply voltage Vdd.

In the circuit diagrams, a reference voltage GND is connected to the bodies of n-channel MOSFETs and n-channel spin MOSFETs, and the power supply voltage Vdd is connected to p-channel MOSFETs and p-channel spin MOSFETs, unless otherwise specified.

(First Embodiment)

Figure 1:
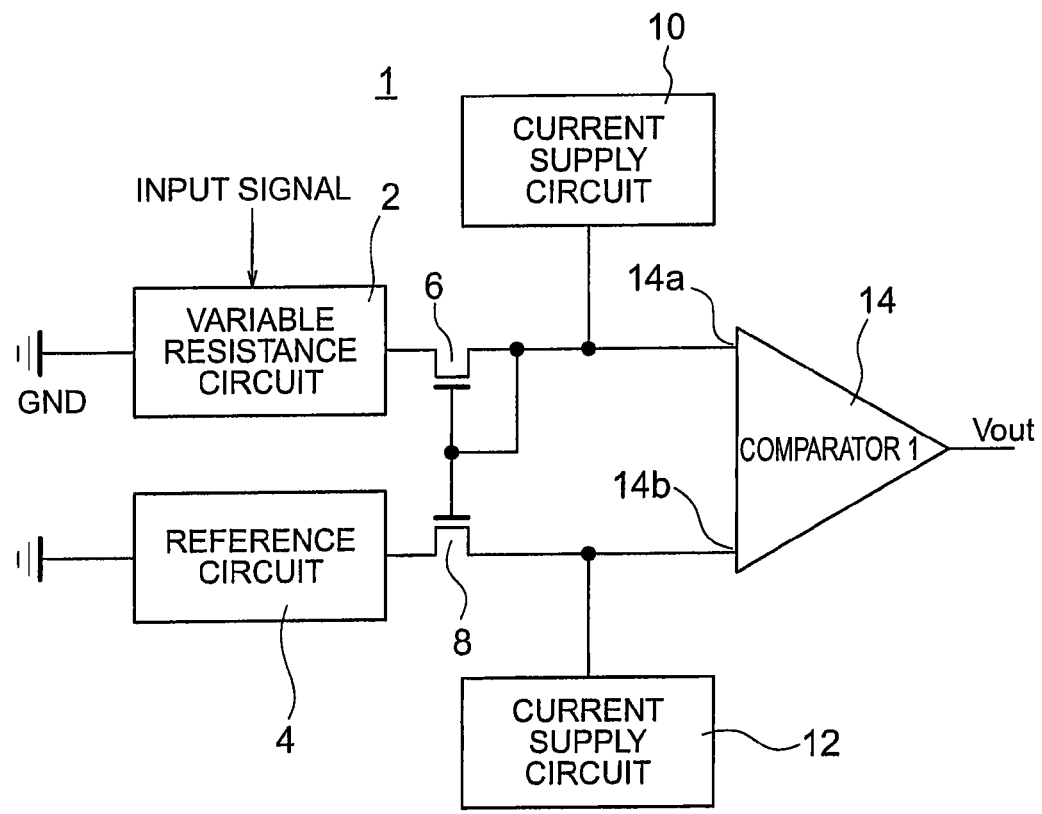
FIG. 1 is a block diagram showing a look-up table circuit according to a first embodiment.

FIG. 1 shows a look-up table circuit according to a first embodiment. The look-up table circuit 1 of this embodiment includes a variable resistance circuit 2, a reference circuit 4, n-channel MOSFETs 6 and 8, current supply circuits 10 and 12, and a comparator 14. The n-channel MOSFET 6 is diode-connected, and the gate of the n-channel MOSFET 6 and the gate of the n-channel MOSFET 8 are connected to each other. That is, the drain of the n-channel MOSFET 6 is connected to the gate of the n-channel MOSFET 6 and an input terminal 14a of the comparator 14. The source of the n-channel MOSFET 6 is connected to one terminal of the variable resistance circuit 2. The source of the n-channel MOSFET 8 is connected to one terminal of the reference circuit 4, the gate of the n-channel MOSFET 8 is connected to the gate of the n-channel MOSFET 6, and the drain of the n-channel MOSFET 8 is connected to the other input terminal 14b of the comparator 14. A current flows from the current supply circuit 10 to the n-channel MOSFET 6 and the variable resistance circuit 2. Also, a current flows from the current supply circuit 12 to the n-channel MOSFET 8 and the reference circuit 4. The other terminal of each of the variable resistance circuit 2 and the reference circuit 4 is connected to the ground voltage GND.

Figure 2:
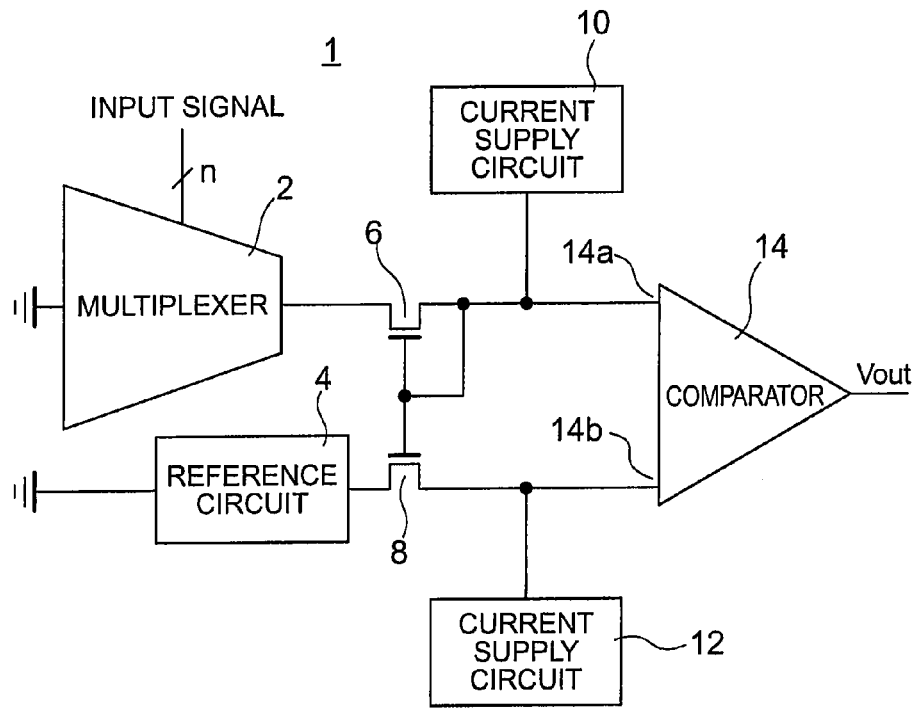
FIG. 2 is a block diagram showing a look-up table circuit according to the first embodiment.
Figure 4:
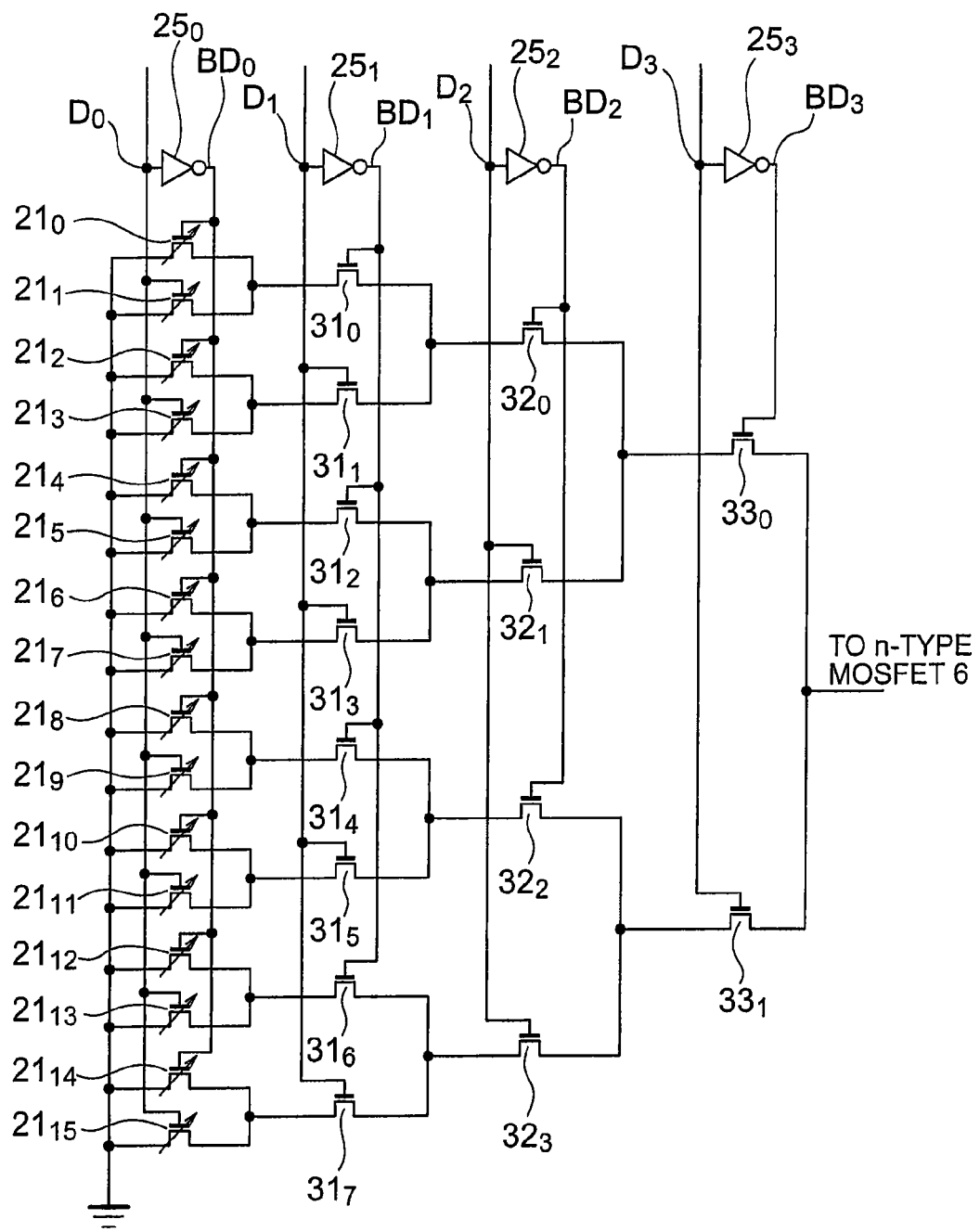
FIG. 4 is a circuit diagram showing a specific example of a multiplexer used in the first embodiment.

The variable resistance circuit 2 includes variable resistance devices, and, based on input signals, selects one of the variable resistance devices. When there is a change in the input signals, the selected variable resistance device is switched to a variable resistance device having a different resistance value, and the resistance of the variable resistance circuit 2 changes. In this embodiment, the later described multiplexer shown in FIG. 4 is used as a specific example of the variable resistance circuit 2. FIG. 2 shows the look-up table circuit of this embodiment in this situation. The multiplexer 2 includes $2^n$ variable resistance devices (spin MOSFETs, for example), and, based on n input signals, selects a variable resistance device from the $2^n$ variable resistance devices.

In this embodiment, when the resistance of the variable resistance circuit 2 changes, the voltage of the input terminal 14a of the comparator 14 changes. Since the input terminal 14a is connected to the gate of the n-channel MOSFET 6, the resistance of the n-channel MOSFET 8 changes, and the voltage of the input terminal 14b of the comparator 14 also changes. For example, if the resistance of the variable resistance circuit 2 becomes higher, the voltage of the input terminal 14a becomes higher, and the voltage of the input terminal 14b becomes lower. In contrast, if the resistance of the variable resistance circuit 2 becomes lower, the voltage of the input terminal 14a becomes lower, and the voltage of the input terminal 14b becomes higher.

In this embodiment, the gate of the n-channel MOSFET 6 and the gate of the n-channel MOSFET 8 are connected to each other, and the respective sources of the MOSFETs 6 and 8 are connected to different circuits. Therefore, the resistance values of the circuits connected from the respective sources of the MOSFETs 6 and 8 to the reference voltage GND also differ from each other. Thus, the structure according to this embodiment is entirely different from a current mirror circuit.

In this embodiment, the gate of the n-channel MOSFET 6 and the gate of the n-channel MOSFET 8 are connected to each other, and the source of each of the MOSFETs 6 and 8 is connected to more than one device. Therefore, the voltages of the source of the n-channel MOSFET 6 and the source of the n-channel MOSFET 8 are higher than the reference voltage GND during operations in this embodiment. At this moment, the drain-source currents of the n-channel MOSFET 6 and the n-channel MOSFET 8 are not in a saturation region. Thus, the operations of this embodiment are entirely different from those of a current mirror circuit.

In this embodiment, the n-channel MOSFET 6 and the n-channel MOSFET 8 serve as differential amplifiers. Therefore, the difference between the voltage entered to the input terminal 14a of the comparator 14 and the voltage entered to the input terminal 14b is amplified, which makes the comparator 14 operate at a high-speed.

Figure 3:
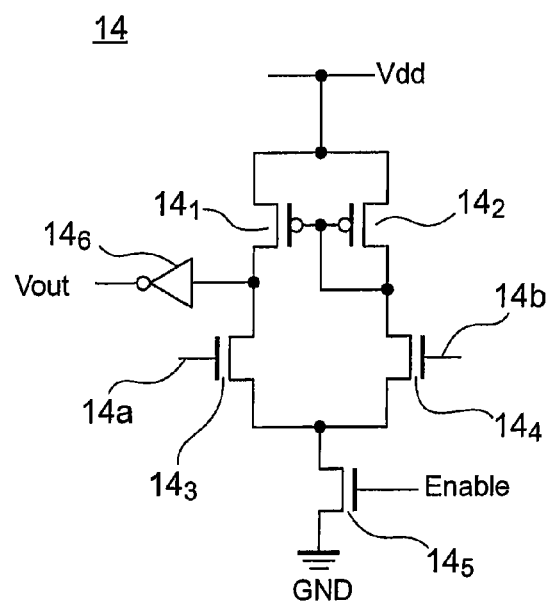
FIG. 3 is a circuit diagram showing a specific example of a comparator used in the first embodiment.

FIG. 3 shows a specific example of this comparator 14. The comparator 14 of this specific example includes p-channel MOSFETs $14_1$ and $14_2$, n-channel MOSFETs $14_3$, $14_4$, and $14_5$, and an inverter $14_6$. The respective sources of the p-channel MOSFETs $14_1$ and $14_2$ are connected to the power supply voltage Vdd, and the respective gates are commonly connected. The drain of the p-channel MOSFET $14_1$ is connected to the input terminal of the inverter $14_6$ and the drain of the n-channel MOSFET $14_3$. The drain of the p-channel MOSFET $14_2$ is connected to the gate of the p-channel MOSFET $14_2$ and the drain of the n-channel MOSFET $14_4$. The n-channel MOSFETs $14_3$ and $14_4$ have the respective gates serving as the input terminals 14a and 14b, and have the respective sources connected to the drain of the n-channel MOSFET $14_5$. An enable signal Enable is entered to the gate of the n-channel MOSFET $14_5$, and the source of the n-channel MOSFET $14_5$ is grounded. The output of the inverter $14_6$ becomes the output Vout of the comparator 14.

In the comparator 14 shown in FIG. 3, the input terminal 14a or 14b, whichever has a higher input voltage applied thereto, operates at a high speed. According to the results of circuit simulations, the comparator 14 operates at substantially the same high speed as a logic gate circuit, if the voltages are equal to or higher than half the power supply voltage Vdd.

In this embodiment, the n-channel MOSFET 6 has a high resistance value, because the n-channel MOSFET 6 is diode-connected. Since the gate of the n-channel MOSFET 8 is connected to the gate of the n-channel MOSFET 6, the resistance of the n-channel MOSFET 8 is also high. Therefore, the voltages of the input terminal 14a and the input terminal 14b are sufficiently higher than half the power supply voltage Vdd. Accordingly, high speed operations can be realized with the use of the comparator 14 of the specific example shown in FIG. 3.

In this embodiment, the input terminal 14a of the comparator 14 shown in FIG. 3 is connected to the drain of the n-channel MOSFET 6, and the input terminal 14b is connected to the drain of the n-channel MOSFET 8. However, in a case where the input terminal 14a is connected to the drain of the n-channel MOSFET 8 and the input terminal 14b is connected to the drain of the n-channel MOSFET 6, which is the opposite of this embodiment, the output from the drain of the p-channel MOSFET $14_1$ in the comparator 14 becomes equal to or smaller than half the output of this embodiment.

In this embodiment, the comparator 14 shown in FIG. 3 can be replaced with a comparator that is capable of comparing the voltages of the input terminal 14a and the input terminal 14b at a high speed.

Also, in this embodiment, the comparator 14 shown in FIG. 3 can be replaced with a comparator that is capable of comparing the value of the current flowing from the input terminal 14a to the variable resistance circuit 2 and the value of the current flowing from the input terminal 14b to the reference circuit 4.

In this embodiment, after the resistance of the variable resistance circuit 2 changes, the operation speed can be made higher until the output of the comparator 14 changes.

FIG. 4 shows a specific example of the multiplexer 2 used in this embodiment. The multiplexer 2 of this specific example is formed by n-channel spin MOSFETs and n-channel MOSFETs. The variable resistance circuit 2 of this specific example is a four-input multiplexer, and includes sixteen spin MOSFETs. Alternatively, the variable resistance circuit 2 of this specific example may be an n-input multiplexer (n being 1 or an integer greater than 1), and in that case, $2^n$ spin MOSFETs are used. Between the single n-channel MOSFET 6 and the reference voltage GND, a single spin MOSFET and (n−1) n-channel MOSFETs are connected in series.

The multiplexer 2 of the specific example shown in FIG. 4 is described. The multiplexer 2 of this specific example is a 4-input, 1-output multiplexer, and includes four control lines $D_0$, $D_1$, $D_2$, and $D_3$, four inversion control lines $BD_0$, $BD_1$, $BD_2$, and $BD_3$, sixteen n-channel spin MOSFETs $21_0$ through $21_{15}$, four inverters $25_0$, $25_1$, $25_2$, and $25_3$, eight n-channel MOSFETs $31_0$ through $31_7$, four n-channel MOSFETs $32_0$ through $32_3$, and two n-channel MOSFETs $33_0$ and $33_1$.

Each inverter $25_i$ (i=0, 1, 2, 3) has an input terminal connected to each corresponding control line $D_i$, and has an output terminal connected to each corresponding inversion control line $BD_i$. That is, a control signal flowing through the inversion control line $BD_i$ is an inverted control signal of the control signal flowing through the control line $D_i$.

The sources of the sixteen spin MOSFETs $21_0$ through $21_{15}$ are connected to the ground voltage GND. The respective gates of the eight spin MOSFETs $21_0$, $21_2$, $21_4$, $21_6$, $21_8$, $21_{10}$, $21_{12}$, and $21_{14}$ are connected to the inversion control line $BD_0$, while the respective gates of the eight spin MOSFETs $21_1$, $21_3$, $21_5$, $21_7$, $21_9$, $21_{11}$, $21_{13}$, and $21_{15}$ are connected to the control line $D_0$.

The respective drains of the two spin MOSFETs $21_0$ and $21_1$ are connected to the source of the MOSFET $31_0$, the respective drains of the two spin MOSFETs $21_2$ and $21_3$ are connected to the source of the MOSFET $31_1$, the respective drains of the two spin MOSFETs $21_4$ and $21_5$ are connected to the source of the MOSFET $31_2$, the respective drains of the two spin MOSFETs $21_6$ and $21_7$ are connected to the source of the MOSFET $31_3$, the respective drains of the two spin MOSFETs $21_8$ and $21_9$ are connected to the source of the MOSFET $31_4$, the respective drains of the two spin MOSFETs $21_{10}$ and $21_{11}$ are connected to the source of the MOSFET $31_5$, the respective drains of the two spin MOSFETs $21_{12}$ and $21_{13}$ are connected to the source of the MOSFET $31_6$, and the respective drains of the two spin MOSFETs $21_{14}$ and $21_{15}$ are connected to the source of the MOSFET $31_7$.

The respective gates of the four MOSFETs $31_0$, $31_2$, $31_4$, and $31_6$ are connected to the inversion control line $BD_1$, and the respective gates of the four MOSFETs $31_1$, $31_3$, $31_5$, and $31_7$ are connected to the control line $D_1$. The respective drains of the two MOSFETs $31_0$ and $31_1$ are connected to the source of the MOSFET $32_0$, the respective drains of the two MOSFETs $31_2$ and $31_3$ are connected to the source of the MOSFET $32_1$, the respective drains of the two MOSFETs $31_4$ and $31_5$ are connected to the source of the MOSFET $32_2$, and the respective drains of the two MOSFETs $31_6$ and $31_7$ are connected to the source of the MOSFET $32_3$.

The respective gates of the two MOSFETs $32_0$ and $32_2$ are connected to the inversion control line $BD_2$, while the respective gates of the two MOSFETs $32_1$ and $32_3$ are connected to the control line $D_2$. The respective drains of the two MOSFETs $32_0$ and $32_1$ are connected to the source of the MOSFET $33_0$, while the respective drains of the two MOSFETs $32_2$ and $32_3$ are connected to the source of the MOSFET $33_1$.

The gate of the MOSFET $33_0$ is connected to the inversion control line $BD_3$, and the drain of the MOSFET $33_0$ is connected to the source of the n-channel MOSFET 6 shown in FIG. 1. The gate of the MOSFET $33_1$ is connected to the control line $D_3$, and the drain of the MOSFET $33_1$ is connected to the source of the n-channel MOSFET 6.

Thus, the multiplexer 2 according to this embodiment can select a spin MOSFET from the sixteen spin MOSFETs $21_0$ through $21_{15}$ by controlling the voltage levels of the four control lines $D_0$, $D_1$, $D_2$, and $D_3$, and conduct the source of the n-channel MOSFET 6 to the ground voltage GND via the selected spin MOSFET. That is, the n-channel MOSFETs $31_0$ through $31_7$, the n-channel MOSFETs $32_0$ through $32_3$, and the n-channel MOSFETs $33_0$ and $33_1$ constitute a select unit for selecting a spin MOSFET from the spin MOSFETs $21_0$ through $21_{15}$.

Figure 5:
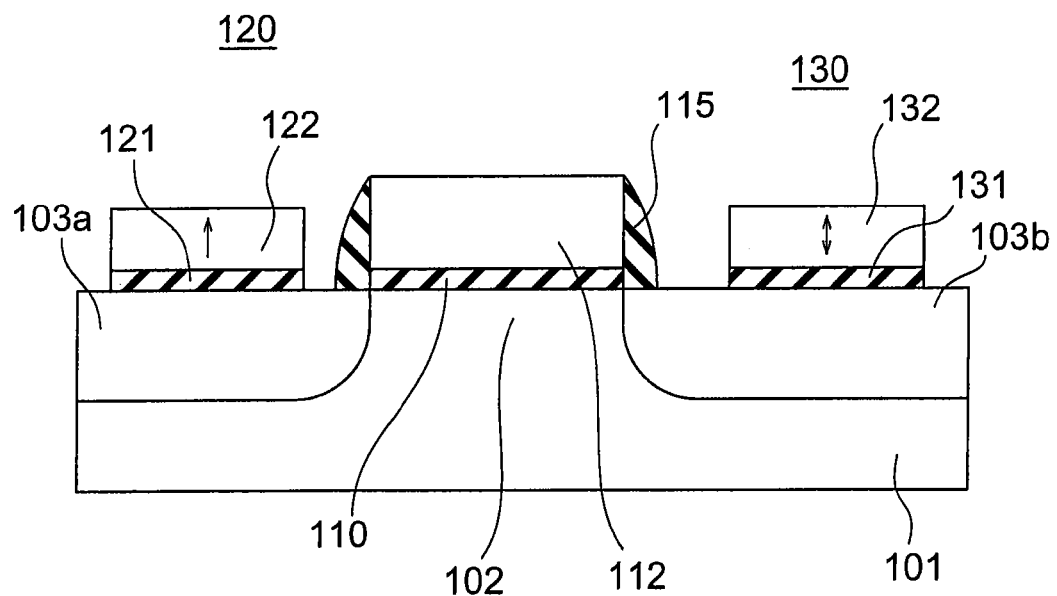
FIG. 5 is a cross-sectional view of a general spin MOSFET.

Next, an n-channel spin MOSFET is described. FIG. 5 shows a general structure of an n-channel spin MOSFET. In this spin MOSFET, n-type source and drain regions 103a and 103b are formed at a distance from each other in a p-type semiconductor region 101, and a gate insulating film 110 is formed on a channel region 102 that is formed between the source region 103a and the drain region 103b, and a gate electrode 112 is formed on the gate insulating film 110. Gate sidewalls 115 made of an insulating material are formed on the outer sides of the side portions of the gate electrode 112. Further, a source electrode 120 and a drain electrode 130 are formed on the source region 103a and the drain region 103b, respectively. The source electrode 120 includes a tunnel insulating film 121 that is formed on the source region 103a and is made of MgO, for example, and a magnetization fixed layer 122 that is formed on the tunnel insulating film 121 and has a ferromagnetic layer with fixed magnetization. The drain electrode 130 includes a tunnel insulating film 131 that is formed on the drain region 103b and is made of MgO, for example, and a magnetization free layer 132 that is formed on the tunnel insulating film 131 and has a ferromagnetic layer with variable magnetization. Here, "fixed magnetization" means that the magnetization direction is invariable before and after a write current is supplied, and "variable magnetization" means that the magnetization direction can be reversed after a write current is supplied. The magnetization directions of the magnetization fixed layer 122 and the magnetization free layer 132 may be both perpendicular to the film plane, or may be both parallel to the film plane. The "film plane" is the upper surface of the ferromagnetic layer. Although the magnetization fixed layer 122 is formed on the source region 103a while the magnetization free layer 132 is formed on the drain region 103b here, the magnetization free layer 132 may be formed on the source region 103a while the magnetization fixed layer 122 is formed on the drain region 103b. Alternatively, the source region 103a and the drain region 103b may not be prepared. In that case, an n-channel magnetic semiconductor region may be used in place of the p-type semiconductor region.

In this spin MOSFET, when a gate voltage is applied to the gate electrode 112, spin-polarized electrons flow from the source to the drain. In this spin MOSFET, the magnetization directions of the magnetization fixed layer 122 and the magnetization free layer 132 can form two spin states with different resistance values: a parallel state and an antiparallel state. The parallel spin state and the antiparallel spin state are to be sustained unless the spin state of the magnetization free layer 132 is reversed by a write current flowing between the source and the drain. Therefore, the spin MOSFET has a memory function.

The magnetization direction of the magnetization free layer 132 can be reversed by applying a gate voltage to the gate electrode 112 to switch on the spin MOSFET, and supplying a write current between the source electrode 120 and the drain electrode 130 through the channel 102. For example, in a case where the magnetization direction of the magnetization free layer 132 is antiparallel to the magnetization direction of the magnetization fixed layer 122, a current is supplied from the drain electrode 130 having the magnetization free layer 132 to the source electrode 120 having the magnetization fixed layer 122 through the channel 102. In that case, the electrons flow in the opposite direction from the current flowing direction; therefore, the electrons flow from the source electrode 120 having the magnetization fixed layer 122 to the drain electrode 130 having the magnetization free layer 132 through the channel 102. At this moment, the electrons are spin-polarized by the magnetization fixed layer 122, and the spin-polarized electrons flow into the magnetization free layer 132 through the channel 102; as a result, the magnetization of the magnetization free layer 132 is subjected to a spin torque, and the magnetization direction of the magnetization free layer 132 becomes parallel to the magnetization direction of the magnetization fixed layer 122.

On the contrary, in a case where the magnetization direction of the magnetization free layer 132 is parallel to the magnetization direction of the magnetization fixed layer 122, a current is supplied from the source electrode 120 having the magnetization fixed layer 122 to the drain electrode 130 having the magnetization free layer 132 through the channel 102. In that case, the electrons flow from the drain electrode 130 having the magnetization free layer 132 to the source electrode 120 having the magnetization fixed layer 122 through the channel 102. At this moment, the electrons are spin-polarized by the magnetization free layer 132, and the spin-polarized electrons flow into the magnetization fixed layer 122 through the channel 102. The electrons with the same direction of spin as that in the magnetization fixed layer 122 pass through the magnetization fixed layer 122; however, the electrons having the opposite direction of spin from that in the magnetization fixed layer 122 are reflected by the interface between the magnetization fixed layer 122 and the tunnel insulating film 121, and the reflected electrons are stored in the magnetization free layer 132 through the channel 102 to act on a spin torque in the opposite direction from the direction of the magnetization of the magnetization free layer 132 so that the magnetization direction of the magnetization free layer 132 is reversed to become antiparallel to the magnetization direction of the magnetization fixed layer 122.

As described above, a spin MOSFET needs to have a write current generating circuit that generates a current for reversing the magnetization direction of the magnetization free layer 132 or the write current. Therefore, the multiplexer 2 shown in FIG. 4 also includes a write current generating circuit (not shown). Such a write current generating circuit is a known component in multiplexers having spin MOSFETs therein, and is disclosed in Japanese Patent No. 4,435,236, for example. In the multiplexer 2 shown in FIG. 4, the current values that are lower than the write current is selected from the currents that read resistances into the spin MOSFETs, i.e., the currents supplied from the current supply circuits 10 and 12 shown in FIG. 1 to the multiplexer 2, so as not to reverse the magnetization direction of the magnetization free layer 122. Alternatively, the write current generating circuits may be included in the current supply circuits 10 and 12. At the time of writing, since the currents flow from the n-channel MOSFET 6 to the respective spin MOSFETs, and vice versa, the source and the drain are interchanged in each MOSFET in that case. The writing is performed in the same manner as above in the other embodiments.

As described above, each spin MOSFET has a memory function, and accordingly, the multiplexer 2 shown in FIG. 4 includes memory functions.

Figure 6:
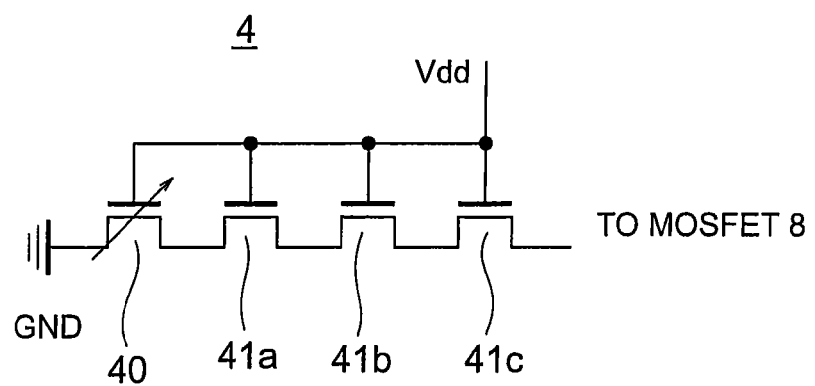
FIG. 6 is a circuit diagram showing a specific example of the reference circuit used in the first embodiment.

FIG. 6 shows a specific example of the reference circuit 4 used in this embodiment. The reference circuit 4 of this specific example, which includes an n-channel spin MOSFET 40 and three n-channel MOSFETs 41a, 41b, and 41c, is used together with the multiplexer 2 shown in FIG. 4, and the n-channel spin MOSFET 40 and the n-channel MOSFETs 41a, 41b, and 41c are connected in series. The reference circuit 4 is designed to have such a structure, because the multiplexer 2 shown in FIG. 4 has the structure that includes the four connected stages of the spin MOSFETs $21_0$ through $21_{15}$, the n-channel MOSFETs $31_0$ through $31_7$, the n-channel MOSFETs $32_0$ through $32_3$, and the n-channel MOSFETs $33_0$ through $33_1$.

The spin MOSFET 40 of the reference circuit 4 shown in FIG. 6 has substantially the same channel length as that of each spin MOSFET in the multiplexer 2 shown in FIG. 4, and has the channel width substantially (1+MR/2) times greater than that of each spin MOSFET in the multiplexer 2. Here, MR represents the resistance change rate of each spin MOSFET. Further, the spin MOSFET 40 is in a high-resistance state (an AP state). However, if the resistance value of the spin MOSFET 40 shown in FIG. 6 is substantially equal to the intermediate value between the largest value and the smallest value of the resistance values of the spin MOSFETs in the multiplexer 2 shown in FIG. 4, the spin MOSFET 40 may not have the above described channel width. Also, if the resistance value of the spin MOSFET 40 shown in FIG. 6 is substantially equal to the intermediate value between the largest value and the smallest value of the resistance values of the spin MOSFETs in the multiplexer 2 shown in FIG. 4, the spin MOSFET 40 may be in a low-resistance state (a P state).

Figure 7:
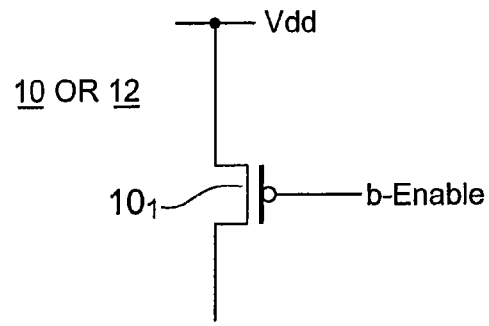
FIG. 7 is a circuit diagram showing a specific example of each current supply circuit used in the first embodiment.

FIG. 7 shows a specific example of each of the current supply circuit 10 and the current supply circuit 12 used in this embodiment. The current supply circuit of this specific example is used as either of the current supply circuit 10 and the current supply circuit 12, and includes a p-channel MOSFET $10_1$. The source of the p-channel MOSFET $10_1$ is connected to the power supply voltage Vdd, the gate of the p-channel MOSFET $10_1$ receives a signal b-Enable that is the inverted signal of the enable signal Enable, and the drain of the p-channel MOSFET $10_1$ is connected to the input terminal 14a or the input terminal 14b of the comparator 14.

When the look-up table circuit 1 of this embodiment is operated, the enable signal Enable is set at the H level, or the signal b-Enable is set at the L level.

Figure 8:
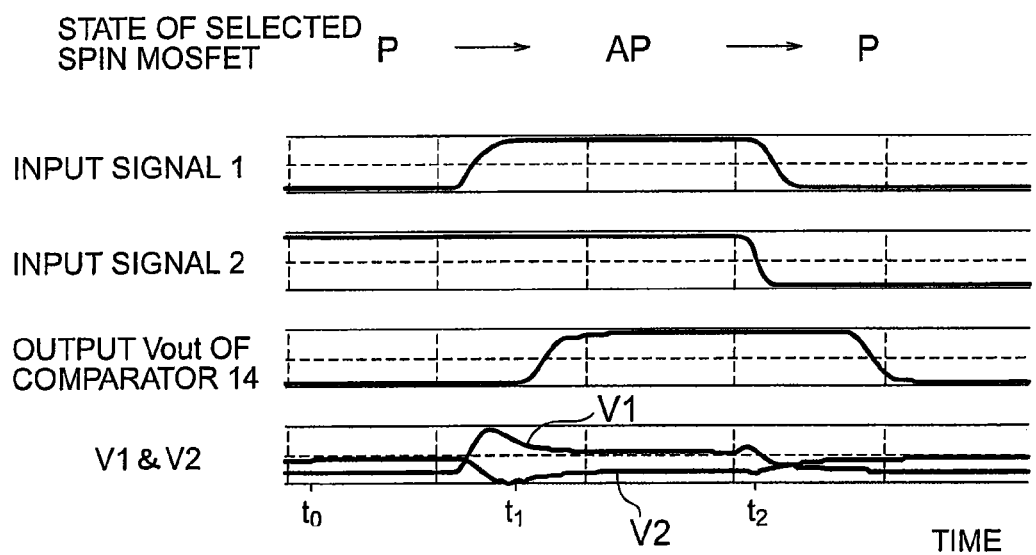
FIG. 8 is a waveform chart for explaining operations of the look-up table circuit of the first embodiment.

Referring now to FIG. 8, the operations of the look-up table circuit 1 of this embodiment are described. FIG. 8 is a waveform chart showing a situation where the output Vout of the comparator 14 varies in response to changes in the resistance value of the multiplexer 2. In FIG. 8, the ordinate axis indicates the voltages of the respective terminals, and the abscissa axis indicates time.

First, the multiplexer 2 selects a spin MOSFET having spins in a P state (a parallel state) (time $t_0$), for example. At this moment, the voltage V1 of the input terminal 14a is lower than the voltage V2 of the input terminal 14b. The output Vout of the comparator 14 is at the L level.

After that, one (the input signal 1 in the example shown in FIG. 8) of the input signals to be entered to the multiplexer 2 changes, and the multiplexer 2 selects a spin MOSFET having spins in an AP state (an antiparallel state) (time $t_1$). At this moment, the voltage V1 of the input terminal 14a becomes higher in response to the resistance change. Further, since the input terminal 14a is connected to the gate of the n-channel MOSFET 8, the voltage V2 of the input terminal 14b becomes lower. Accordingly, the voltage difference between the voltage V1 of the input terminal 14a and the voltage V2 of the input terminal 14b is amplified.

After that, input signals (the input signals 1 and 2 in the example shown in FIG. 8) change, and the multiplexer 2 selects a spin MOSFET in the P state (time $t_2$). At this moment, the voltage V1 of the input terminal 14a becomes lower as the resistance changes. Further, since the input terminal 14a is connected to the gate of the n-channel MOSFET 8, the voltage V2 of the input terminal 14b becomes higher. Accordingly, the voltage difference between the voltage V1 of the input terminal 14a and the voltage V2 of the input terminal 14b is amplified.

Each operating time of the look-up table circuit 1 may be regarded as the time elapsing from a change in the input signals to a change in the output Vout of the comparator 14.

Figure 9:
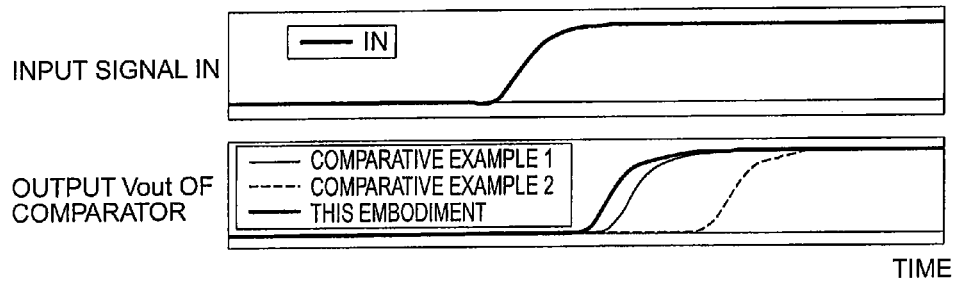
FIG. 9 is a waveform chart for explaining operations of the first embodiment, Comparative Example 1, and Comparative Example 2.
Figure 10:
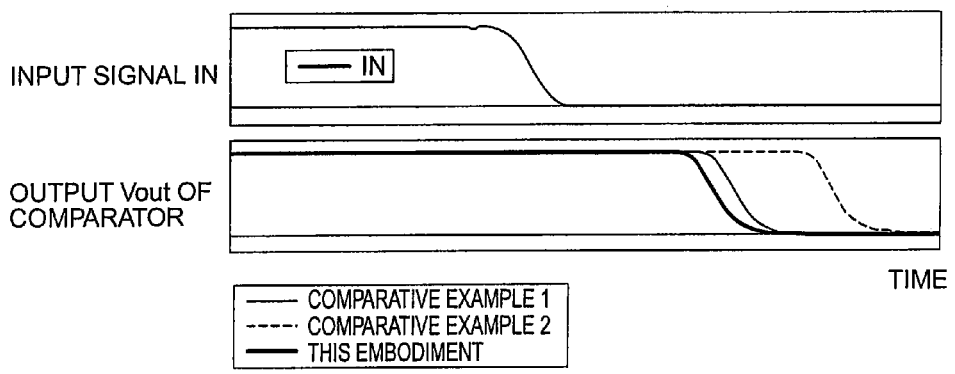
FIG. 10 is a waveform chart for explaining operations of the first embodiment, Comparative Example 1, and Comparative Example 2.

Next, a look-up table circuit having the same structure as the look-up table circuit 1 of this embodiment except that the n-channel MOSFET 6 and the n-channel MOSFET 8 are deleted is described as Comparative Example 1. A look-up table circuit having the same structure as the look-up table circuit of Comparative Example 1 except that current mirror circuits are used as the current supply circuits 10 and 12 is described as Comparative Example 2. FIGS. 9 and 10 show the results of simulations performed on the outputs of the comparators 14 of the respective look-up table circuits of this embodiment and Comparative Example 1 and 2: In one of the simulations, a signal to be entered to the multiplexer 2 was changed from the L level to the H level, and in the other, a signal to be entered to the multiplexer 2 was changed from the H level to the L level. As shown in FIGS. 9 and 10, each operating time of this embodiment is shorter than those of Comparative Examples 1 and 2, which means that the higher-speed operations can be performed according to this embodiment.

Also, in this embodiment, the resistance value of each selected spin MOSFET can be determined.

(Second Embodiment)

Figure 11:
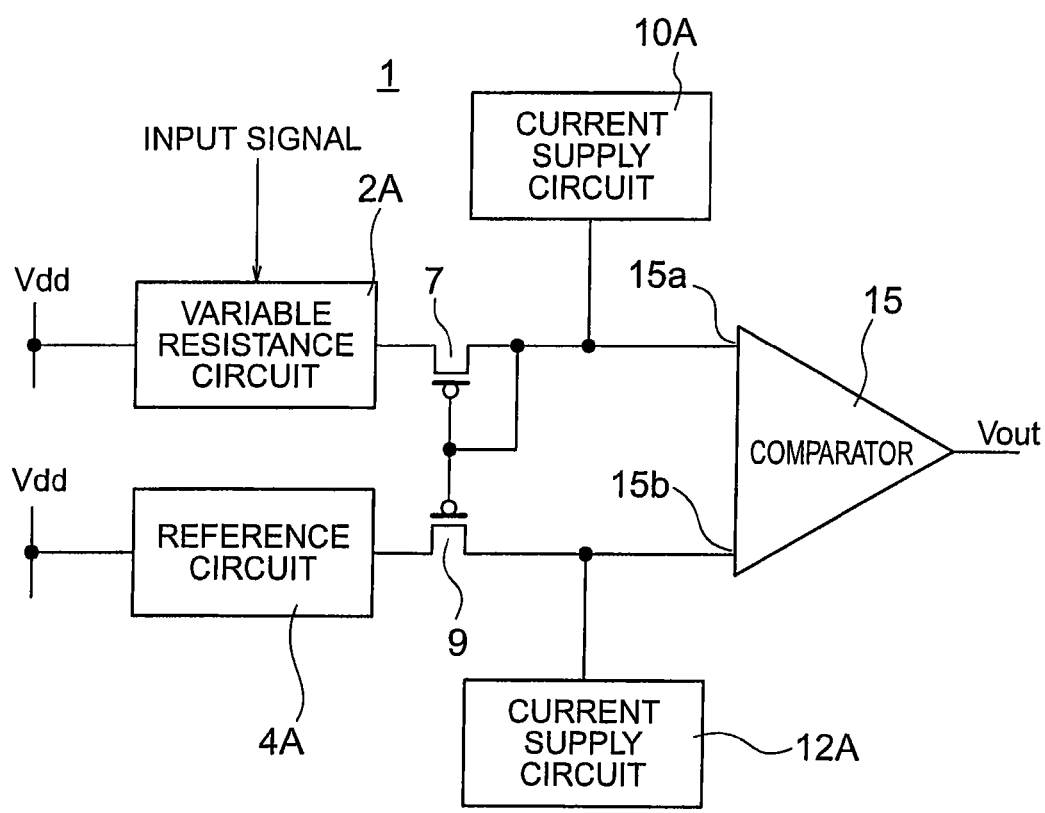
FIG. 11 is a block diagram showing a look-up table circuit according to a second embodiment.

FIG. 11 shows a look-up table circuit 1 according to a second embodiment. This look-up table circuit 1 of the second embodiment differs from the look-up table circuit of the first embodiment in that the variable resistance circuit 2, the reference circuit 4, the n-channel MOSFETs 6 and 8, the current supply circuits 10 and 12, and the comparator 14 are replaced with a variable resistance circuit 2A, a reference circuit 4A, p-channel MOSFETs 7 and 9, current supply circuits 10A and 12A, and a comparator 15.

One terminal of the variable resistance circuit 2A is connected to the power supply voltage Vdd, and the other terminal is connected to the source of the p-channel MOSFET 7. Likewise, one terminal of the reference circuit 4A is connected to the power supply voltage Vdd, and the other terminal is connected to the source of the p-channel MOSFET 9. The gate of the p-channel MOSFET 7 is connected to the gate of the p-channel MOSFET 9 and the drain of the p-channel MOSFET 7. That is, the p-channel MOSFET 7 is diode-connected. The drain of the p-channel MOSFET 7 is connected to the current supply circuit 10A and an input terminal 15a of the comparator 15. The drain of the p-channel MOSFET 9 is connected to the current supply circuit 12A and an input terminal 15b of the comparator 15.

Figure 12:
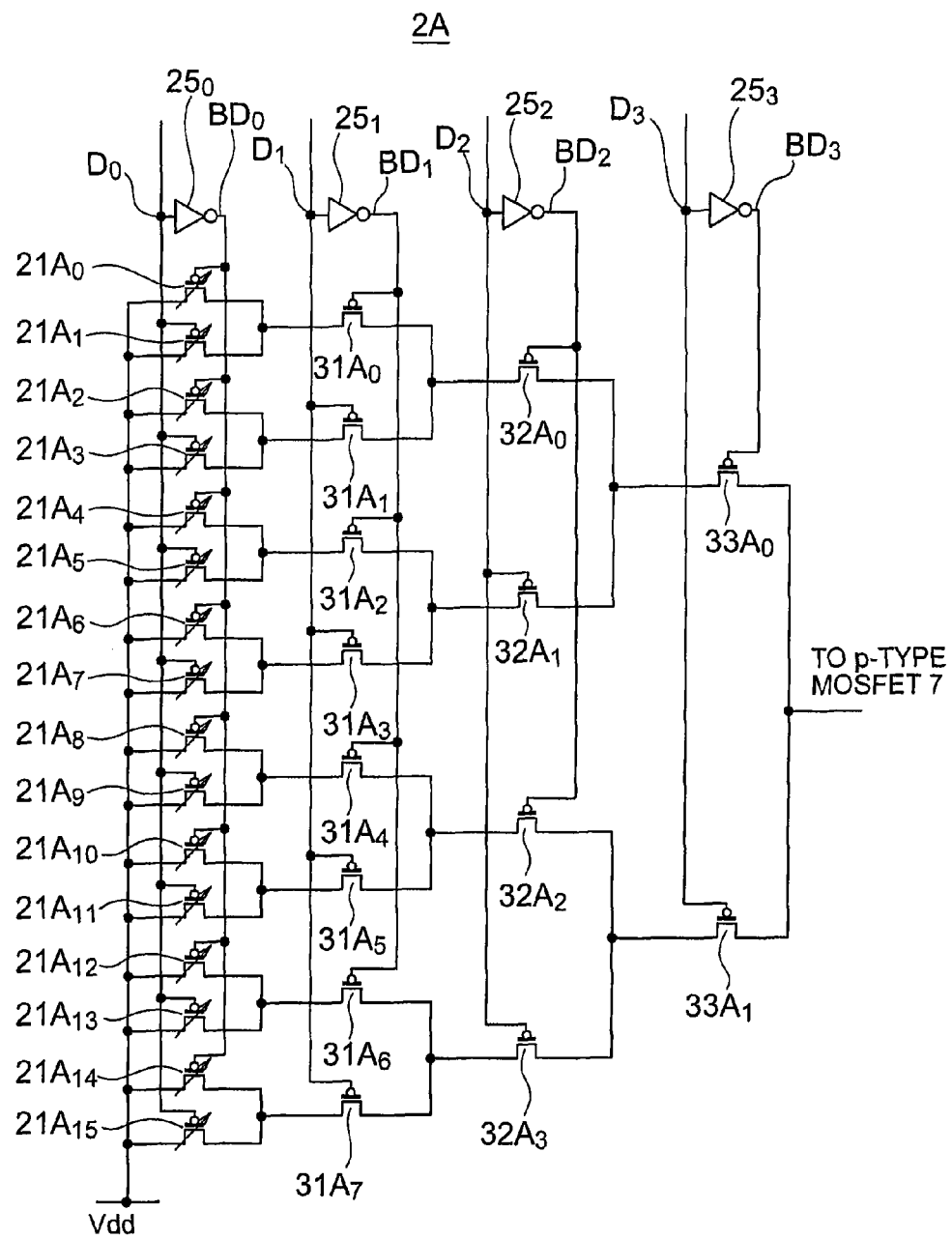
FIG. 12 is a circuit diagram showing a specific example of a multiplexer used in the second embodiment.

Like the variable resistance circuit 2, the variable resistance circuit 2A includes variable resistance devices, and, based on input signals, selects one of the variable resistance devices. When there is a change in the input signals, the selected variable resistance device is switched to a variable resistance device having a different resistance value, and the resistance of the variable resistance circuit 2A changes. As a specific example of this variable resistance circuit 2A, FIG. 12 shows a multiplexer 2A including p-channel spin MOSFETs, which differs from the 4-input, 1-output multiplexer 2 shown in FIG. 4 in that the n-channel spin MOSFETs $21_0$ through $21_{15}$ are replaced with p-channel MOSFETs $21A_0$ through $21A_{15}$, the n-channel MOSFETs $31_0$ through $31_7$, $32_0$ through $32_3$, and $33_0$ and $33_1$ are replaced with p-channel MOSFETs $31A_0$ through $31A_7$, $32A_0$ through $32A_3$, and $33A_0$ and $33A_1$, and the power supply voltage Vdd is connected to the sources of the respective p-channel spin MOSFETs $21A_0$ through $21A_{15}$.

Figure 13:
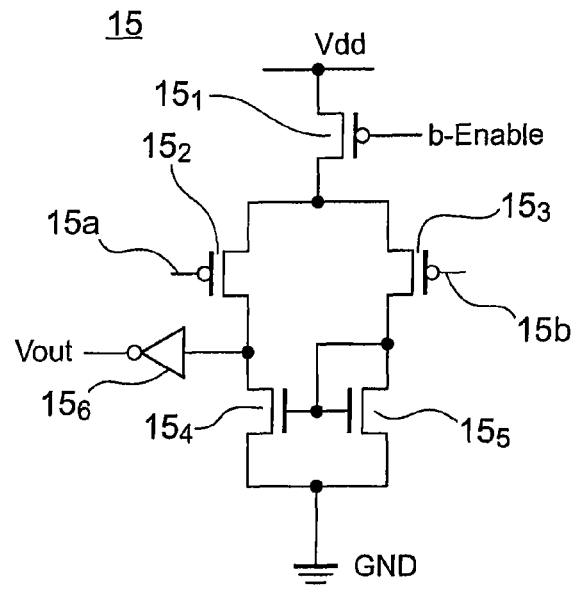
FIG. 13 is a circuit diagram showing a specific example of a comparator used in the second embodiment.

FIG. 13 shows a specific example of a comparator 15 used in this embodiment. The comparator 15 of this specific example includes n-channel MOSFETs $15_4$ and $15_5$, p-channel MOSFETs $15_1$, $15_2$, and $15_3$, and an inverter $15_6$.

The source of the p-channel MOSFET $15_1$ is connected to the power supply voltage Vdd, the inverted signal b-Enable of the enable signal Enable is entered to the gate of the p-channel MOSFET $15_1$, and the drain of the p-channel MOSFET $15_1$ is connected to the respective sources of the p-channel MOSFETs $15_2$ and $15_3$. The p-channel MOSFETs $15_2$ and $15_3$ have the respective gates serving as the input terminals 15a and 15b. The drain of the p-channel MOSFET $15_2$ is connected to the input terminal of the inverter $15_6$ and the drain of the n-channel MOSFET $15_4$. The drain of the p-channel MOSFET $15_3$ is connected to the drain and gate of the n-channel MOSFET $15_5$. The respective sources of the n-channel MOSFETs $15_4$ and $15_5$ are connected to the ground voltage GND.

In the comparator 15, the input terminal 15a or the input terminal 15b, whichever has the lower voltage, operates at a high speed. In the second embodiment shown in FIG. 11, the p-channel MOSFET 7 is diode-connected, and therefore, has a high resistance value. Also, since the gate of the p-channel MOSFET 9 is connected to the gate of the p-channel MOSFET 7, the resistance of the p-channel MOSFET 9 is high. Therefore, the voltages of the input terminal 15a and the input terminal 15b are sufficiently low. Thus, high-speed operations can be performed with the use of the comparator 15 shown in FIG. 13 in this embodiment.

Figure 14:
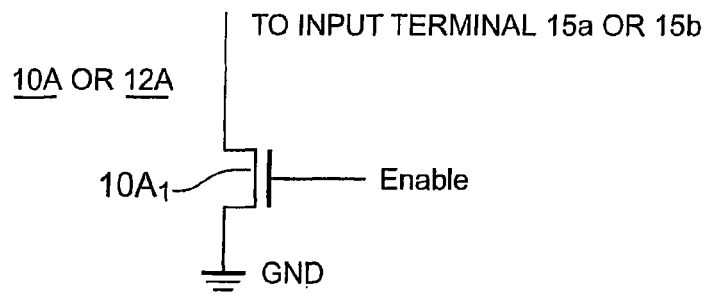
FIG. 14 is a circuit diagram showing a specific example of each current supply circuit used in the second embodiment.

FIG. 14 shows a specific example of each of the current supply circuit 10A and the current supply circuit 12A used in this embodiment. The current supply circuit of this specific example includes an n-channel MOSFET $10A_1$, which has the drain thereof connected to the input terminal 15a or the input terminal 15b, the gate thereof receive the enable signal Enable, and the source thereof connected to the ground voltage GND.

Figure 15:
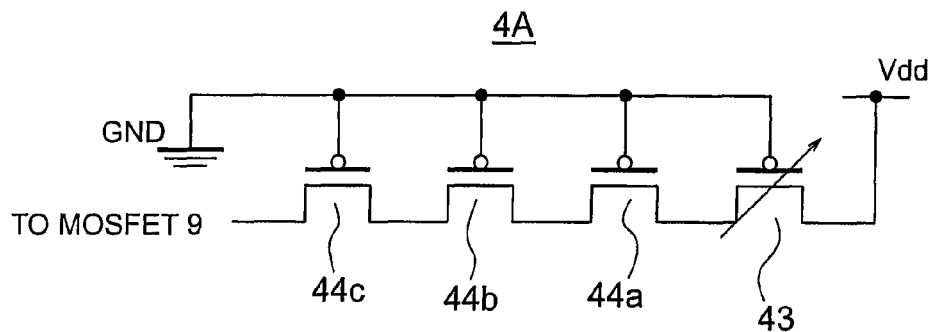
FIG. 15 is a circuit diagram showing a specific example of the reference circuit used in the second embodiment.

In a case where the variable resistance circuit 2A is a 4-input, 1-output multiplexer including sixteen p-channel spin MOSFETs and fourteen p-channel MOSFETs, the reference circuit 4A shown in FIG. 15 is used as the reference circuit 4A in this embodiment, for example. The reference circuit 4A shown in FIG. 15 differs from the reference circuit 4 shown in FIG. 6 in that the n-channel spin MOSFET 40 is replaced with a p-channel spin MOSFET 43, the n-channel MOSFETs 41a through 41c are replaced with p-channel MOSFETs 44a through 44c, the ground voltage GND is replaced with the power supply voltage Vdd, and the power supply voltage Vdd is replaced with the ground voltage GND, respectively.

In this embodiment, the resistance value of each selected spin MOSFET can be determined, as in the first embodiment.

Also, in this embodiment, the voltage difference between the input terminal 15a and the input terminal 15b is amplified, and therefore, high-speed operations can be performed. Further, the look-up table circuit of this embodiment operates at a higher speed than the look-up table circuit of the comparative examples that do not include the p-channel MOSFET 7 and the p-channel MOSFET 9.

Like the first embodiment, this embodiment can provide a look-up table circuit with a high operation speed.

(Third Embodiment)

Figure 16:
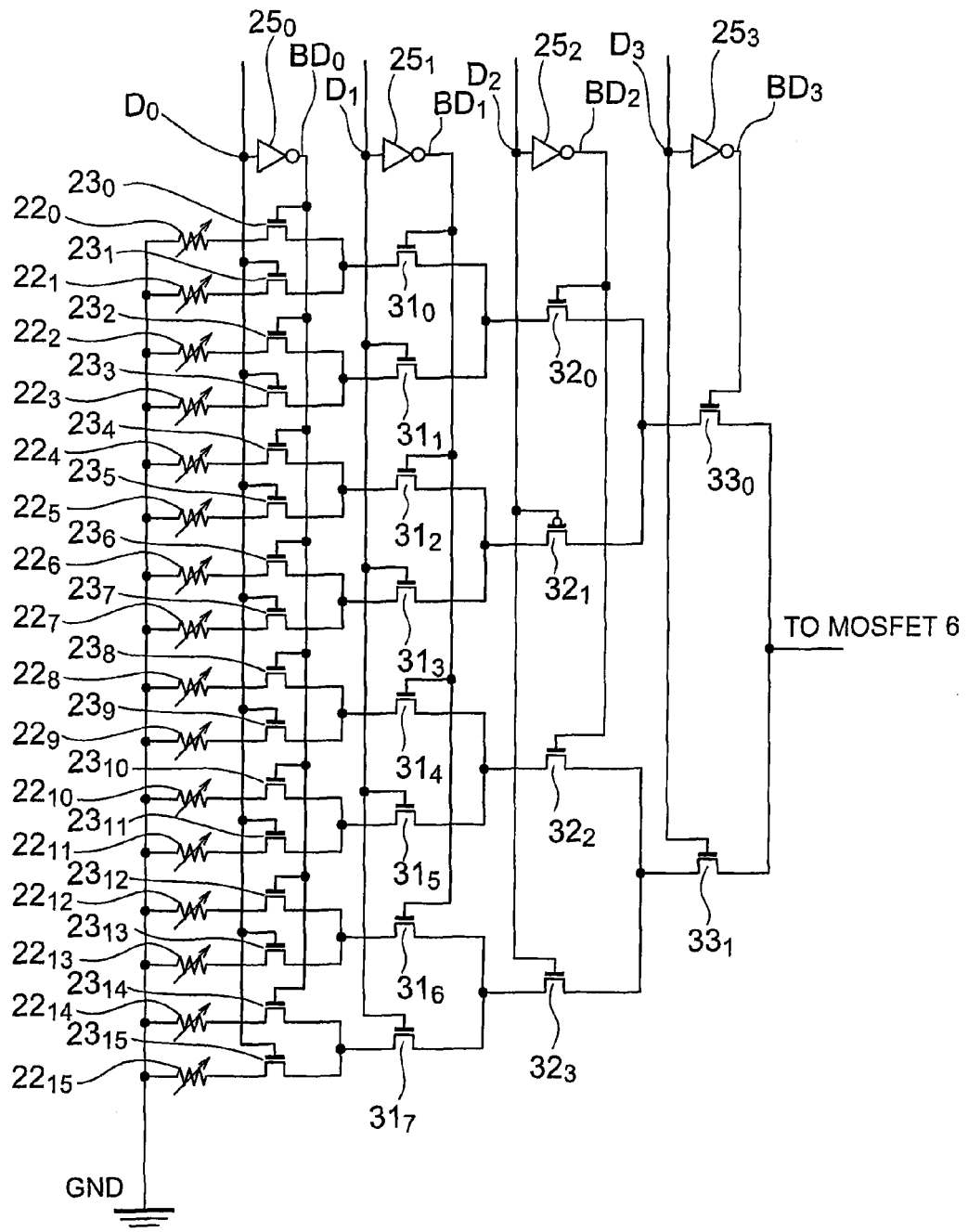
FIG. 16 is a circuit diagram showing a specific example of the variable resistance circuit used in a third embodiment.

FIG. 16 shows a look-up table circuit 1 according to a third embodiment. This look-up table circuit 1 of the third embodiment differs from the look-up table circuit of the first embodiment in that the spin MOSFETs $21_i$ (i=0, ..., 15) of the multiplexer 2 shown in FIG. 4 are replaced with variable resistance devices 22; and n-channel MOSFETs $23_i$.

As the look-up table circuit 1 of the third embodiment operates in the same manner as the look-up table circuit 1 of the first embodiment, the resistance value of each selected variable resistance device can be determined.

Also, like the first embodiment, this embodiment can realize higher-speed operations than the operations performed by the comparative examples that do not include the n-channel MOSFET 6 and the n-channel MOSFET 8.

(Fourth Embodiment)

A look-up table circuit according to a fourth embodiment is the same as the look-up table circuit 2A of the second embodiment, except that the p-channel spin MOSFETs $21A_0$ through $21A_{15}$ used in the multiplexer 2 are replaced with variable resistance devices and p-channel MOSFETs respectively as in the third embodiment.

Like the look-up table circuit 1 of the second embodiment, the look-up table circuit 1 of this embodiment can realize high-speed operations.

Also, in this embodiment, the resistance value of each selected variable resistance device can be determined as in the third embodiment.

(Fifth Embodiment)

Figure 17:
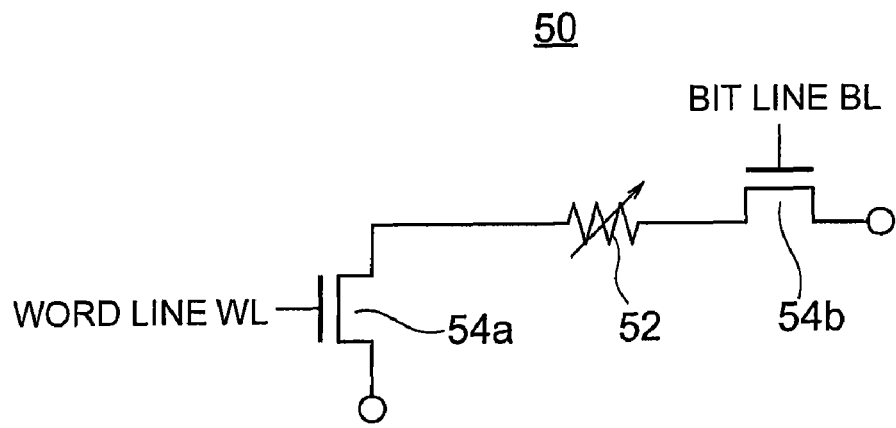
FIG. 17 is a circuit diagram showing a first specific example of the variable resistance circuit used in a fifth embodiment.

Referring now to FIG. 17, a look-up table circuit according to a fifth embodiment is described.

In each of the above described first through fourth embodiments, a multiplexer is described as a specific example of the variable resistance circuit 2. In the fifth embodiment, the variable resistance circuit of one of the first through fourth embodiments is replaced with a variable resistance circuit that includes cells 50 arranged in a matrix form, each of which includes at least one variable resistance device 52 and two select transistors 54a and 54b as shown in FIG. 17.

In this embodiment, the variable resistance circuit 2 of the first through fourth embodiments is formed by the cells 50 arranged in a matrix form. In this embodiment, the resistance values of the cells 50 are read by the n-channel MOSFET 6 and the n-channel MOSFET 8 or by the p-channel MOSFET 7 and the n-channel MOSFET 9 at a high speed in the same circuit structure as those of the first through fourth embodiments.

A word line WL for selecting a cell and a bit line BL for reading the resistance value of the variable resistance device 52 from the cell are connected to the select transistor 54a and the select transistor 54b, respectively, of each cell 50. In each of the cells 50, the variable resistance device 52 and the two select transistors 54a and 54b are connected in series. In FIG. 17, the variable resistance device 52 is placed between the select transistor 54a and the select transistor 54b. One terminal of the source and drain of the select transistor 54a is connected to one terminal of the variable resistance device 52, and the other terminal is connected to the n-channel MOSFET 6 shown in FIG. 1, for example. One terminal of the source and drain of the select transistor 54b is connected to the other terminal of the variable resistance device 52, and the other terminal is connected to the ground voltage GND shown in FIG. 1, for example.

Figure 18:
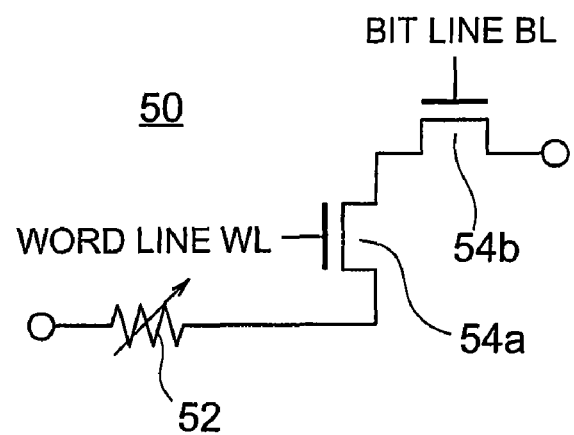
FIG. 18 is a circuit diagram showing a second specific example of the variable resistance circuit used in the fifth embodiment.

Alternatively, one terminal of the variable resistance device 52 can be connected to a terminal of one of the select transistors 54a and 54b connected in series, as shown in FIG. 18. In FIG. 18, one terminal of the variable resistance device 52 is connected to a terminal of the select transistor 54a.

The reference circuits 4 and 4A preferably have the same structure as the above described cells 50, and are preferably designed so that the resistance value of the variable resistance device included in the reference circuits 4 and 4A is substantially equal to the intermediate value between the largest value and the smallest value among the resistance values of the variable resistance devices of the above described cells 50.

Figure 19:
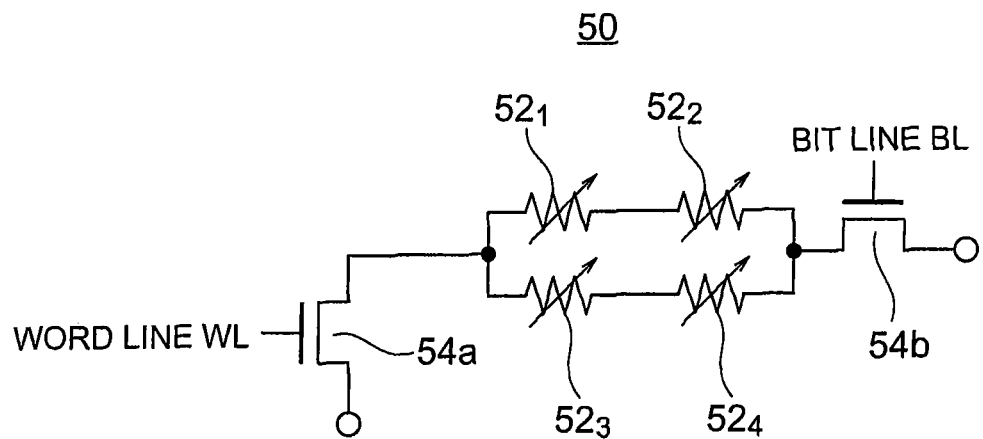
FIG. 19 is a circuit diagram showing a third specific example of the variable resistance circuit used in the fifth embodiment.
Figure 20:
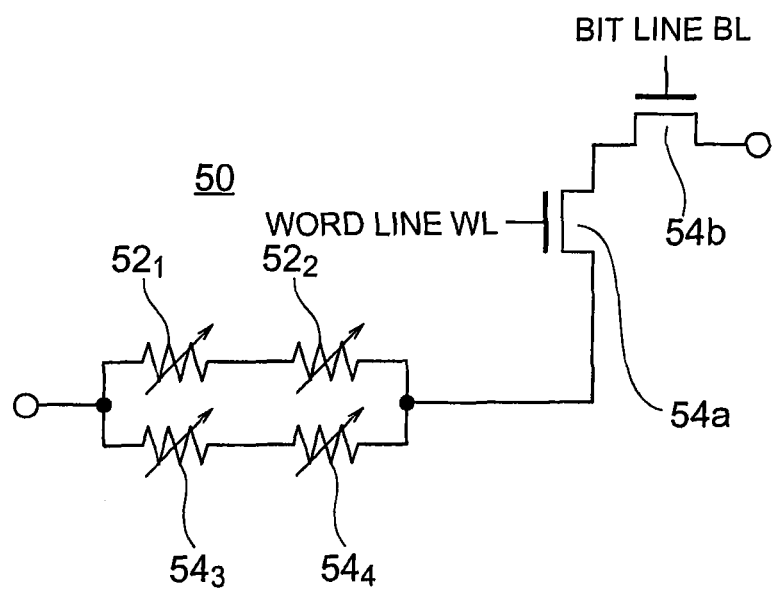
FIG. 20 is a circuit diagram showing a fourth specific example of the variable resistance circuit used in the fifth embodiment.

As shown in each of FIGS. 19 and 20, the reference circuit 4 or the reference circuit 4A can include more than one variable resistance devices $52_1$ through $52_4$ (four variable resistance devices in each of FIGS. 19 and 20). In each of FIGS. 19 and 20, the variable resistance devices 52$_1$ and 52$_2$ are connected in series to constitute a first series circuit, the variable resistance devices 52$_3$ and 52$_4$ are connected in series to constitute a second series circuit, and the first series circuit and the second series circuit are connected in parallel.

In this embodiment, the resistance value of each selected variable resistance device can be determined at a high speed as in the first through fourth embodiments.

The cells 50 shown in FIGS. 17 and 18 can be used as memory cells of a nonvolatile memory.

(Sixth Embodiment)

In this embodiment, look-up table circuits according to one of the first through fifth embodiments are used to constitute a cluster logic block (CLB).

The cluster logic block of this embodiment can form a high-speed logic circuit, using look-up table circuits that operate at a high speed according to one of the first through fifth embodiments.

Figure 21:
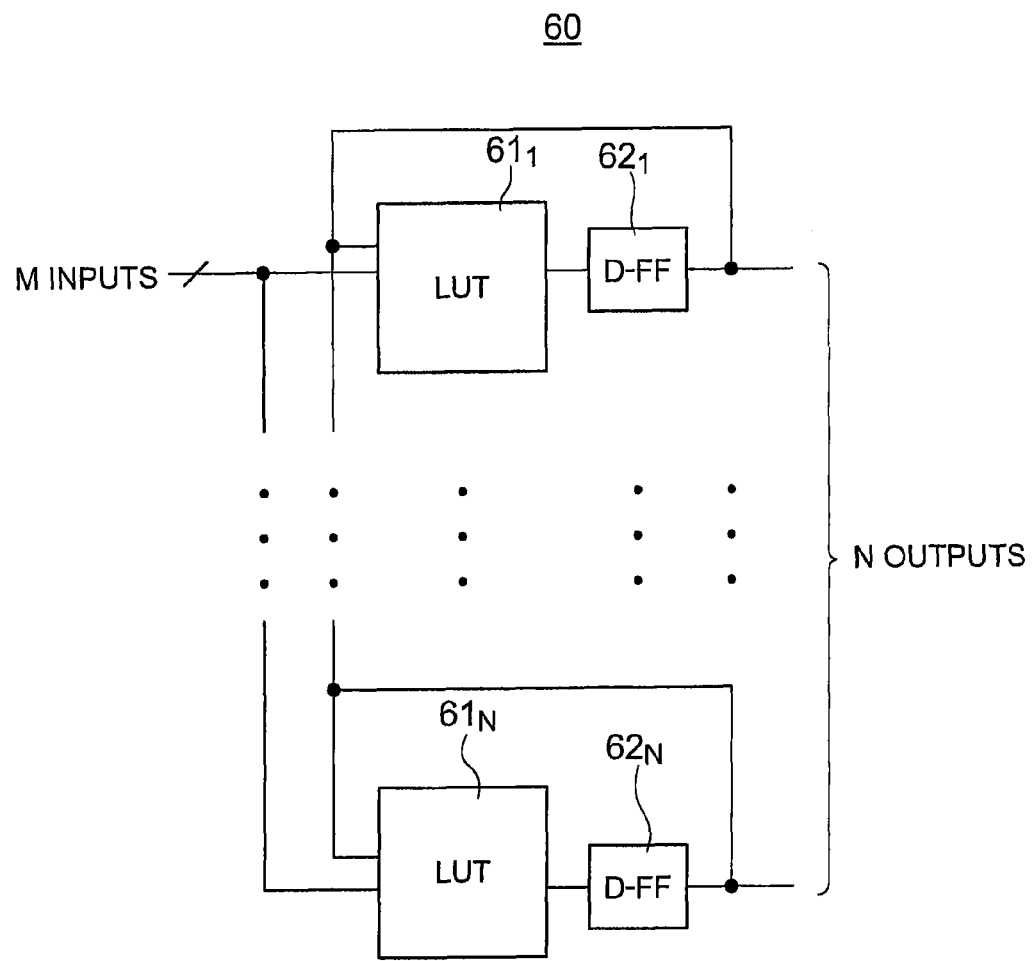
FIG. 21 is a block diagram showing a cluster logic block according to a sixth embodiment.

FIG. 21 shows the cluster logic block (CLB) according to the sixth embodiment. The CLB 60 of this embodiment includes N look-up table circuits 61$_1$ through 61$_N$, and D-flip-flop circuits 62$_i$ (i=1, . . . , N) that are employed to correspond to the look-up table circuits 61$_i$ (i=1, . . . , N) and are connected in series to the corresponding look-up table circuits 61$_i$ (i=1, . . . , N). As the look-up table circuits 61$_1$ through 61$_N$, look-up table circuits according to one of the first through fifth embodiments are used. M input signals are entered to the respective look-up table circuits 61$_1$ through 61$_N$. The output terminals of the look-up table circuits 61$_i$ (i=1, . . . , N) are connected to the input terminals of the D-flip-flop circuits 62$_i$ (i=1, . . . , N), and the output of each D-flip-flop circuit 62$_i$ (i=1, . . . , N) is fed back to the inputs of the look-up table circuits 61$_i$ (i=1, . . . , N).

The CLB of the sixth embodiment can perform high-speed operations.

(Seventh Embodiment)

This embodiment is a FPGA including cluster logic blocks (CLB) formed with the use of look-up table circuits according to one of the first through fifth embodiments.

In this embodiment, a FPGA including cluster logic blocks of the sixth embodiment is used. However, the cluster logic blocks in the FPGA may not be cluster logic blocks of the sixth embodiment, as long as the cluster logic blocks are formed with the use of look-up table circuits of one of the first through fifth embodiments.

Figure 22:
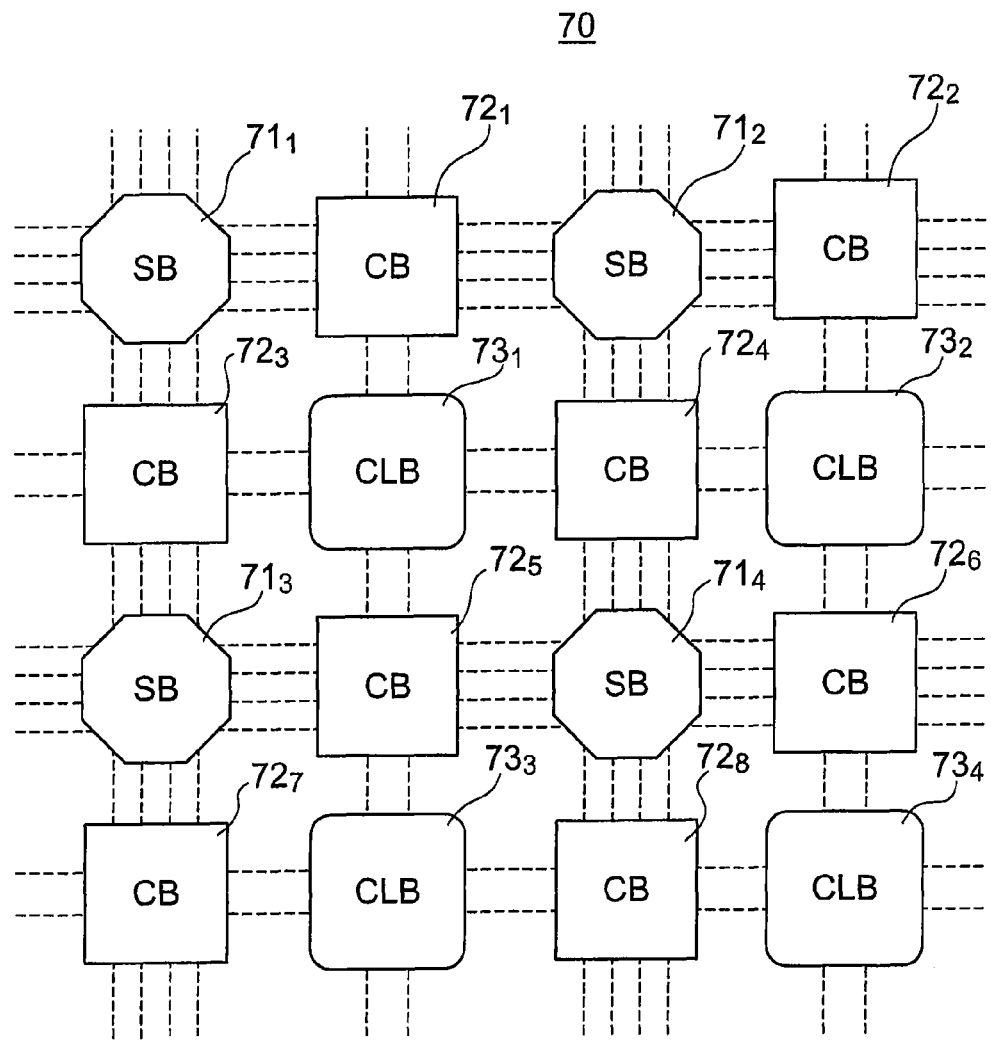
FIG. 22 is a block diagram showing a FPGA according to a seventh embodiment.

FIG. 22 shows the field programmable gate array (FPGA) 70 according to the seventh embodiment. The FPGA 70 of the seventh embodiment includes switching boxes (SBs) 71$_1$ through 71$_4$, connection boxes (CBs) 72$_1$ through 72$_8$, and cluster logic blocks (CLBs) 73$_1$ through 73$_4$. Each CLB has a CB positioned on each of the left, right, top, and bottom thereof, and one SB is placed between each two adjacent CBs. For example, the CBs 72$_1$, 72$_3$, 72$_4$, and 72$_5$ are positioned on the left, right, top, and bottom of the SB 73$_1$, respectively, and the SB 71$_3$ is positioned between the adjacent CBs 72$_3$ and 72$_7$. The SBs 71$_1$ through 71$_4$, CBs 72$_1$ through 72$_8$, and CLBs 73$_1$ through 73$_4$ are connected by interconnects. In FIG. 22, each single line represents interconnects. Connections are determined by the SBs and the CBs, and logic operations are performed by the CLBs.

In the seventh embodiment, CLBs including look-up table circuits of one of the first through fifth embodiments are used. Accordingly, in this embodiment, the FPGA can perform high-speed operations.

In the seventh embodiment, CLBs according to the sixth embodiment are used as the CLBs. Accordingly, in this embodiment, the FPGA can perform high-speed operations.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. A look-up table circuit comprising:
   a variable resistance circuit comprising a plurality of variable resistance devices and selecting a variable resistance device from the plurality of variable resistance devices based on an input signal, a first terminal of the variable resistance circuit being connected to a ground voltage;
   a reference circuit having a resistance value between the largest resistance value and the smallest resistance value of the variable resistance circuit, a first terminal of the reference circuit being connected to the ground voltage;
   a first n-channel MOSFET comprising a source connected to a second terminal of the variable resistance circuit, and comprising a gate and a drain connected each other;
   a second n-channel MOSFET comprising a source connected to a second terminal of the reference circuit and comprising a gate connected to the gate of the first n-channel MOSFET;
   a first current supply circuit to supply a current to the variable resistance circuit through the drain of the first n-channel MOSFET;
   a second current supply circuit to supply a current to the reference circuit through a drain of the second n-channel MOSFET; and
   a comparator to compare voltages at a first input terminal and a second input terminal, the first input terminal connected to the drain of the first n-channel MOSFET and the second input terminal connected to the drain of the second n-channel MOSFET.

2. The look-up table circuit according to claim 1, wherein the variable resistance circuit is a multiplexer that includes:
   a plurality of control lines to which the input signal can be entered;
   a plurality of n-channel spin MOSFETs comprising sources and drains including a ferromagnetic material respectively; and
   a select unit comprising a plurality of n-channel MOSFETs and selecting an n-channel spin MOSFET from the plurality of n-channel spin MOSFETs based on the input signal entered through the control lines.

3. The look-up table circuit according to claim 1, wherein the comparator includes:
   first and second p-channel MOSFETs comprising respective sources connected to a power supply voltage and comprising respective gates connected to each other;
   a third n-channel MOSFET comprising a drain connected to a drain of the first p-channel MOSFET and comprising a gate serving as one of the first and second input terminals;
   a fourth n-channel MOSFET comprising a drain connected to a drain and the gate of the second p-channel MOSFET and comprising a gate serving as the other of the first and second input terminals; and
   a fifth n-channel MOSFET comprising a drain connected to respective sources of the third and fourth n-channel MOSFETs, comprising a gate to receive an enable signal and comprising a source being connected to the ground voltage.

4. The look-up table circuit according to claim 1, wherein the variable resistance circuit includes a plurality of cells arranged in a matrix form,
  each of the cells including the variable resistance device, a first select transistor, and a second select transistor, wherein a first input signal for selecting the variable resistance device is entered to a gate of the first select transistor, a second input signal for selecting the variable resistance device is entered to a gate of the second select transistor, and the first select transistor and the second select transistor are connected in series to the variable resistance device.

5. A look-up table circuit comprising:
  a variable resistance circuit comprising a plurality of variable resistance devices and selecting a variable resistance device from the plurality of variable resistance devices based on an input signal, a first terminal of the variable resistance circuit being connected to a power supply voltage;
  a reference circuit having a resistance value between the largest resistance value and the smallest resistance value of the variable resistance circuit, a first terminal of the reference circuit being connected to the power supply voltage;
  a first p-channel MOSFET comprising a source connected to a second terminal of the variable resistance circuit, and comprising a gate and a drain connected to each other;
  a second p-channel MOSFET comprising a source connected to a second terminal of the reference circuit and comprising a gate connected to the gate of the first p-channel MOSFET;
  a first current supply circuit to supply a current to the variable resistance circuit through the drain of the first p-channel MOSFET;
  a second current supply circuit to supply a current to the reference circuit through a drain of the second p-channel MOSFET; and
  a comparator to compare voltages at a first input terminal and a second input terminal, the first input terminal connected to the drain of the first p-channel MOSFET and the second input terminal connected to the drain of the second p-channel MOSFET.

6. The look-up table circuit according to claim 5, wherein the variable resistance circuit is a multiplexer that includes:
  a plurality of control lines to which the input signal can be entered;
  a plurality of p-channel spin MOSFETs comprising sources and drains including a ferromagnetic material respectively; and
  a select unit comprising a plurality of p-channel MOSFETs and select a p-channel spin MOSFET from the plurality of p-channel spin MOSFETs based on the input signal entered through the control lines.

7. The look-up table circuit according to claim 5, wherein the comparator includes:
  first and second n-channel MOSFETs comprising respective sources connected to a ground voltage and comprising respective gates connected to each other;
  a third p-channel MOSFET comprising a drain connected to a drain of the first n-channel MOSFET and comprising a gate serving as one of the first and second input terminals;
  a fourth p-channel MOSFET comprising a drain connected to a drain and the gate of the second n-channel MOSFET and comprising a gate serving as the other of the first and second input terminals; and
  a fifth p-channel MOSFET comprising a drain connected to respective sources of the third and fourth p-channel MOSFETs, comprising a gate to receive an enable signal and comprising a source being connected to the power supply voltage.

8. The look-up table circuit according to claim 5, wherein the variable resistance circuit includes a plurality of cells arranged in a matrix form,
  each of the cells including the variable resistance device, a first select transistor, and a second select transistor, wherein a first input signal for selecting the variable resistance device is entered to a gate of the first select transistor, a second input signal for selecting the variable resistance device is entered to a gate of the second select transistor, and the first select transistor and the second select transistor are connected in series to the variable resistance device.

9. A field programmable gate array comprising
  the look-up table circuit according to claim 1, wherein
  the field programmable gate array performs logic operations based on the look-up table circuit.

10. The gate array according to claim 9, wherein the variable resistance circuit is a multiplexer that includes:
  a plurality of control lines to which the input signal can be entered;
  a plurality of n-channel spin MOSFETs comprising sources and drains including a ferromagnetic material respectively; and
  a select unit comprising a plurality of n-channel MOSFETs and select an n-channel spin MOSFET from the plurality of n-channel spin MOSFETs based on the input signal entered through the control lines.

11. The gate array according to claim 9, wherein the comparator includes:
  first and second p-channel MOSFETs comprising respective sources connected to a power supply voltage and comprising respective gates connected to each other;
  a third n-channel MOSFET comprising a drain connected to a drain of the first p-channel MOSFET and comprising a gate serving as one of the first and second input terminals;
  a fourth n-channel MOSFET comprising a drain connected to a drain and the gate of the second p-channel MOSFET and comprising a gate serving as the other of the first and second input terminals; and
  a fifth n-channel MOSFET comprising a drain connected to respective sources of the third and fourth n-channel MOSFETs, comprising a gate to receive an enable signal and comprising a source being connected to the ground voltage.

12. The gate array according to claim 9, wherein the variable resistance circuit includes a plurality of cells arranged in a matrix form,
  each of the cells including the variable resistance device, a first select transistor, and a second select transistor, wherein a first input signal for selecting the variable resistance device is entered to a gate of the first select transistor, a second input signal for selecting the variable resistance device is entered to a gate of the second select transistor, and the first select transistor and the second select transistor are connected in series to the variable resistance device.

13. A field programmable gate array comprising
the look-up table circuit according to claim 5, wherein
the field programmable gate array performs logic operations based on the look-up table circuit.

14. The gate array according to claim 13, wherein the variable resistance circuit is a multiplexer that includes:
 a plurality of control lines to which the input signal can be entered;
 a plurality of p-channel spin MOSFETs comprising sources and drains including a ferromagnetic material respectively; and
 a select unit comprising a plurality of p-channel MOSFETs and selecting a p-channel spin MOSFET from the plurality of p-channel spin MOSFETs based on the input signal entered through the control lines.

15. The gate array according to claim 13, wherein the comparator includes:
 first and second n-channel MOSFETs comprising respective sources connected to a ground voltage and comprising respective gates connected to each other;
 a third p-channel MOSFET comprising a drain connected to a drain of the first n-channel MOSFET and comprising a gate serving as one of the first and second input terminals;
 a fourth p-channel MOSFET comprising a drain connected to a drain and the gate of the second n-channel MOSFET and comprising a gate serving as the other of the first and second input terminals; and
 a fifth p-channel MOSFET comprising a drain connected to respective sources of the third and fourth p-channel MOSFETs, comprising a gate to receive an enable signal and comprising a source being connected to the power supply voltage.

16. The gate array according to claim 13, wherein the variable resistance circuit includes a plurality of cells arranged in a matrix form,
 each of the cells including the variable resistance device, a first select transistor, and a second select transistor, wherein a first input signal for selecting the variable resistance device is entered to a gate of the first select transistor, a second input signal for selecting the variable resistance device is entered to a gate of the second select transistor, and the first select transistor and the second select transistor are connected in series to the variable resistance device.

* * * * *